(12) United States Patent
Ko

(10) Patent No.: US 7,470,628 B2
(45) Date of Patent: Dec. 30, 2008

(54) ETCHING METHODS

(75) Inventor: Kei-Yu Ko, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 11/130,760

(22) Filed: May 17, 2005

(65) Prior Publication Data
US 2005/0218373 A1   Oct. 6, 2005

Related U.S. Application Data

(62) Division of application No. 09/945,508, filed on Aug. 30, 2001, now Pat. No. 6,989,108.

(51) Int. Cl.
*H01L 21/302* (2006.01)
(52) U.S. Cl. .................. 438/710; 438/714; 438/723; 438/743; 252/79.1
(58) Field of Classification Search .......... 438/706, 438/710, 723, 714, 743; 252/79.1, 79.4; 25/79.4
See application file for complete search history.

(56) References Cited

U.S. PATENT DOCUMENTS

| | | | |
|---|---|---|---|
| 4,381,201 A | 4/1983 | Sakurai | 148/1.5 |
| 4,472,729 A | 9/1984 | Shibata et al. | 357/49 |
| 4,489,478 A | 12/1984 | Sakurai | 29/574 |
| 4,672,740 A | 6/1987 | Shirai et al. | 438/655 |
| 4,681,657 A | 7/1987 | Hwang et al. | 156/657 |
| 4,753,709 A | 6/1988 | Welch et al. | 156/643 |
| 4,807,016 A | 2/1989 | Douglas | 357/67 |
| 4,818,335 A | 4/1989 | Karnett | 156/644 |
| 4,966,865 A | 10/1990 | Welch et al. | 437/192 |
| 5,022,958 A | 6/1991 | Favreau et al. | 438/297 |
| 5,037,777 A | 8/1991 | Mele et al. | 437/195 |
| 5,063,169 A | 11/1991 | DeBruin et al. | 437/41 |
| 5,084,417 A | 1/1992 | Joshi et al. | 437/192 |
| 5,150,276 A | 9/1992 | Gonzalez et al. | 361/313 |

(Continued)

FOREIGN PATENT DOCUMENTS

EP   0 265 584 A2   5/1987

(Continued)

OTHER PUBLICATIONS

Abatchev et al., *Study of the Boron-Phosphorous Doped and Undoped Silicate Glass Etching in $CHF_3/Ar$ Plasma*, 96 Electrochem Soc. Proceedings, No. 12, pp. 522-530 (1996).

(Continued)

*Primary Examiner*—Binh X Tran
(74) *Attorney, Agent, or Firm*—Wells St. John P.S.

(57) ABSTRACT

Processes, etchants, and apparatus useful for etching an insulating oxide layer of a substrate without damaging underlying nitride features or field oxide regions. The processes exhibit good selectivity to both nitrides and field oxides. Integrated circuits produced utilizing etching processes of the present invention are much less likely to be defective due to photoresist mask misalignment. Etchants used in processes of the present invention comprise a carrier gas, one or more $C_{2+}F$ gases, $CH_2F_2$, and a gas selected from the group consisting of $CHF_3$, $CF_4$, and mixtures thereof. The processes can be performed at power levels lower than what is currently utilized in the prior art.

16 Claims, 7 Drawing Sheets

U.S. PATENT DOCUMENTS

| | | | |
|---|---|---|---|
| 5,192,703 A | 3/1993 | Lee et al. .................. 437/52 |
| 5,208,176 A | 5/1993 | Ahmad et al. .............. 437/47 |
| 5,210,047 A | 5/1993 | Woo et al. ................. 437/43 |
| 5,229,311 A | 7/1993 | Lai et al. .................. 438/143 |
| 5,252,517 A | 10/1993 | Blalock et al. ............ 437/195 |
| 5,269,879 A | 12/1993 | Rhoades et al. ........... 438/694 |
| 5,286,344 A * | 2/1994 | Blalock et al. ............ 438/723 |
| 5,298,465 A | 3/1994 | Levy ........................ 437/225 |
| 5,312,768 A | 5/1994 | Gonzalez .................. 437/40 |
| 5,321,286 A | 6/1994 | Koyama et al. ........... 257/315 |
| 5,323,047 A | 6/1994 | Nguyen .................... 257/384 |
| 5,362,358 A | 11/1994 | Yamagata et al. |
| 5,362,666 A | 11/1994 | Dennison .................. 437/52 |
| 5,366,590 A | 11/1994 | Kadomura ................. 156/662 |
| 5,374,332 A | 12/1994 | Koyama et al. ........... 156/643 |
| 5,393,704 A | 2/1995 | Huang et al. .............. 438/305 |
| 5,401,681 A | 3/1995 | Dennison .................. 437/60 |
| 5,403,779 A | 4/1995 | Joshi et al. ................ 438/634 |
| 5,422,308 A | 6/1995 | Nicholls et al. ........... 437/192 |
| 5,423,945 A | 6/1995 | Marks et al. .............. 156/662.1 |
| 5,429,070 A | 7/1995 | Campbell et al. .......... 118/723 |
| 5,430,328 A | 7/1995 | Hsue ........................ 257/750 |
| 5,445,712 A | 8/1995 | Yanagida .................. 156/662 |
| 5,478,772 A | 12/1995 | Fazan ....................... 437/60 |
| 5,482,894 A | 1/1996 | Havemann ................ 437/195 |
| 5,485,035 A | 1/1996 | Lin et al. .................. 257/637 |
| 5,550,071 A | 8/1996 | Ryou ........................ 437/41 |
| 5,611,888 A | 3/1997 | Bosch et al. ............... 156/643.1 |
| 5,626,716 A | 5/1997 | Bosch et al. ............... 438/723 |
| 5,643,819 A | 7/1997 | Tseng ....................... 437/60 |
| 5,658,425 A | 8/1997 | Halman et al. ............ 438/620 |
| 5,677,227 A | 10/1997 | Yang et al. ................ 437/60 |
| 5,685,914 A | 11/1997 | Hills et al. ................ 118/723 |
| 5,685,951 A | 11/1997 | Torek et al. ............... 156/646.1 |
| 5,700,731 A | 12/1997 | Lin et al. .................. 438/381 |
| 5,705,427 A | 1/1998 | Chan et al. ................ 257/384 |
| 5,712,202 A | 1/1998 | Liaw et al. ................ 438/253 |
| 5,731,130 A | 3/1998 | Tseng ....................... 430/316 |
| 5,731,242 A | 3/1998 | Parat et al. ................ 438/586 |
| 5,736,455 A | 4/1998 | Iyer et al. .................. 138/592 |
| 5,747,369 A | 5/1998 | Kantimahanti et al. ..... 438/241 |
| 5,780,338 A | 7/1998 | Jeng et al. ................. 438/253 |
| 5,783,496 A | 7/1998 | Flanner et al. ............. 438/743 |
| 5,792,689 A | 8/1998 | Yang et al. ................ 438/253 |
| 5,792,703 A | 8/1998 | Bronner et al. ............ 438/620 |
| 5,817,579 A | 10/1998 | Ko et al. ................... 438/740 |
| 5,821,594 A | 10/1998 | Kasai ....................... 257/410 |
| 5,828,096 A | 10/1998 | Ohno et al. ................ 257/306 |
| 5,830,807 A | 11/1998 | Matsunaga ................ 438/714 |
| 5,851,896 A | 12/1998 | Summerfelt ............... 438/396 |
| 5,866,483 A * | 2/1999 | Shiau et al. ................ 438/720 |
| 5,871,659 A | 2/1999 | Sakano et al. ............. 216/79 |
| 5,883,436 A | 3/1999 | Sadjadi et al. ............. 257/760 |
| 5,893,787 A * | 4/1999 | Chan et al. ................ 445/24 |
| 5,897,352 A | 4/1999 | Lin et al. .................. 438/255 |
| 5,908,320 A | 6/1999 | Chu et al. .................. 438/743 |
| 5,918,120 A | 6/1999 | Huang ...................... 438/239 |
| 5,936,272 A | 8/1999 | Lee .......................... 257/306 |
| 5,946,568 A | 8/1999 | Hsiao et al. ............... 438/253 |
| 5,986,299 A | 11/1999 | Nakamura et al. ......... 257/296 |
| 5,990,507 A | 11/1999 | Mochizuki et al. ......... 257/295 |
| 5,997,757 A | 12/1999 | Nagayama et al. |
| 6,010,946 A * | 1/2000 | Hisamune et al. .......... 438/405 |
| 6,015,760 A * | 1/2000 | Becker et al. .............. 438/714 |
| 6,065,481 A | 5/2000 | Fayfield et al. ............ 134/1.3 |
| 6,074,488 A | 6/2000 | Roderick et al. ........... 118/728 |
| 6,074,958 A | 6/2000 | Tokunaga et al. .......... 438/724 |
| 6,110,287 A | 8/2000 | Arai et al. |
| 6,117,788 A | 9/2000 | Ko ........................... 438/706 |
| 6,117,791 A | 9/2000 | Ko et al. ................... 438/723 |
| 6,121,671 A | 9/2000 | Ko et al. ................... 257/644 |
| 6,124,191 A | 9/2000 | Bohr ........................ 438/595 |
| 6,153,490 A | 11/2000 | Xing et al. ................ 438/396 |
| 6,159,862 A | 12/2000 | Yamada et al. ............ 438/712 |
| 6,165,880 A | 12/2000 | Yaung et al. .............. 438/592 |
| 6,171,970 B1 | 1/2001 | Xing et al. ................ 438/706 |
| 6,174,451 B1 | 1/2001 | Hung et al. ................ 216/67 |
| 6,183,655 B1 | 2/2001 | Wang et al. ............... 216/68 |
| 6,194,325 B1 * | 2/2001 | Yang et al. ................ 438/740 |
| 6,242,759 B1 | 6/2001 | Yamazaki et al. .......... 257/69 |
| 6,254,966 B1 | 7/2001 | Kondo ...................... 428/156 |
| 6,271,542 B1 | 8/2001 | Emma et al. .............. 257/67 |
| 6,277,758 B1 | 8/2001 | Ko ........................... 438/706 |
| 6,337,285 B1 | 1/2002 | Ko ........................... 438/714 |
| 6,362,073 B2 * | 3/2002 | Kim ......................... 438/422 |
| 6,362,109 B1 | 3/2002 | Kim et al. ................. 438/706 |
| 6,372,605 B1 | 4/2002 | Kuehne et al. ............. 438/427 |
| 6,376,383 B2 * | 4/2002 | Mitsuiki ................... 438/706 |
| 6,432,833 B1 | 8/2002 | Ko ........................... 438/714 |
| 6,458,685 B2 | 10/2002 | Ko et al. ................... 438/621 |
| 6,635,335 B1 * | 10/2003 | Donohoe et al. ........... 428/156 |
| 6,849,557 B1 | 2/2005 | Ko ........................... 438/738 |
| 6,962,879 B2 * | 11/2005 | Zhu et al. .................. 438/724 |
| 2002/0000422 A1 | 1/2002 | Donohoe |

FOREIGN PATENT DOCUMENTS

| | | |
|---|---|---|
| EP | 0 465 044 A2 | 6/1991 |
| EP | 0 496 614 A1 | 1/1992 |
| EP | 0 680 084 A1 | 4/1995 |
| EP | 0 763 850 A1 | 8/1996 |
| JP | 56-114355 | 9/1981 |
| JP | 60-42821 | 3/1985 |
| JP | 61-133555 | 12/1986 |
| JP | 4-345054 | 1/1992 |
| JP | 614691 | 8/1992 |
| JP | 4-360570 | 12/1992 |
| JP | 5-335482 | 12/1993 |
| JP | 669166 | 3/1994 |
| JP | 06-204219 | 7/1994 |
| JP | 06-244153 | 9/1994 |
| JP | 07-335570 | 12/1995 |
| JP | 07-335639 | 12/1995 |
| JP | 08-055835 | 2/1996 |
| JP | 8181121 | 7/1996 |
| JP | 8250449 | 9/1996 |
| JP | 08-306662 | 11/1996 |
| JP | 08-316201 | 11/1996 |
| JP | 08-316313 | 11/1996 |
| WO | WO 98/49719 | 11/1998 |

OTHER PUBLICATIONS

Ikegami et al., *Mechanisms of High PSG/SiO$_2$ Selective Etching in a Highly Polymerized Fluorocarbon Plasma*, 30 Jap. J. Appl. Phys., No. 7, pp. 1556-1561 (Jul. 1991).

van den Hoek et al., *Isotropic plasma etching of doped and undoped silicon dioxide for contract holes and vias*, 7 J. Vac. Sci. Technol., No. 3, pp. 670-675 (May/Jun. 1989).

* cited by examiner

ETCHING METHODS

RELATED PATENT DATA

This patent resulted from a divisional application of U.S. patent application Ser. No. 09/945,508, which was filed Aug. 30, 2001 now U.S. Pat. No. 6,989,108.

FIELD OF THE INVENTION

The present invention relates generally to etching of semiconductor integrated circuits. More specifically, the present invention relates to the etching of contact holes through insulating oxide layers.

BACKGROUND OF THE INVENTION

In the semiconductor processing industry there continues to be a need to pack an increasing number of electronic devices, such as transistors and capacitors, onto a single integrated circuit chip. This continuously increasing level of integration is accomplished in large part by decreasing the minimum feature sizes of the devices. Feature alignment from one semiconductor level to the next is of critical importance, particularly relating to the alignment of contact holes with the underlying structures with which they are to connect, such as active areas. Device miniaturization complicates the process of forming interconnect structures because in order to maintain sufficient electrical communication, the interconnect structure must be formed in exact alignment with an underlying active region. At the same time, the area of the interconnect structure interfacing with the active area must be maximized. Thus, as device sizes shrink there is less room for misalignment errors of the interconnect structure.

As minimum feature sizes decrease, it becomes increasingly more difficult to control the photolithographic alignment within design tolerances and to control the critical dimensions. Misalignment of the photoresist mask can inadvertently result in etching underlying insulating layers causing electrical shorts between the various electrically conducting elements.

The prior art has been successful at developing etching processes that exhibit significantly higher etch rates for insulating oxides than nitrides. That is, these etching processes are highly selective to nitrides. One approach to improving nitride selectivity, involves the use of certain fluorocarbon gases in the etching gas (that is, the etchant). The fluorocarbons known in the art for nitride selectivity have two or more carbon atoms and no hydrogen atoms. Accordingly, these nitride-selective fluorocarbons will be referred to in the present specification as $C_{2+}F$ gases or $C_{2+}F$ chemistry. $C_{2+}F$ gases include $C_3F_6$, $C_3F_8$, $C_4F_6$, $C_4F_8$, and $C_5F_8$, for example.

SUMMARY OF THE INVENTION

The present invention addresses issues and drawbacks of the prior art. The present invention provides etching processes and etchant gases useful for etching through a selected portion of an insulating oxide layer on a substrate to create a contact hole without damaging underlying nitride layers or field oxide regions. Etching processes of the present invention employ an etchant gas comprising an inert gas, one or more $C_{2+}F$ gases, $CH_2F_2$, and a gas selected from the group consisting of $CHF_3$, $CF_4$, and mixtures thereof. The etchant gas chemistry of the present invention provides good selectivity to field oxide isolation regions while retaining sufficient nitride selectivity. Thus, the present invention allows the etching of an insulating oxide layer down to a substrate without substantially damaging underlying nitride layers or underlying field oxide isolation regions, making etching processes of the present invention less susceptible than prior art processes to damage that can occur as a result of misaligned photoresist masks. Etching processes of the present invention are performed at power levels lower than is generally used in the prior art. Additional advantages and features of the present invention will be more apparent from the detailed description and accompanying drawings, which illustrate preferred embodiments of the invention.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION OF THE PREFERRED EMBODIMENTS

Figure 1:
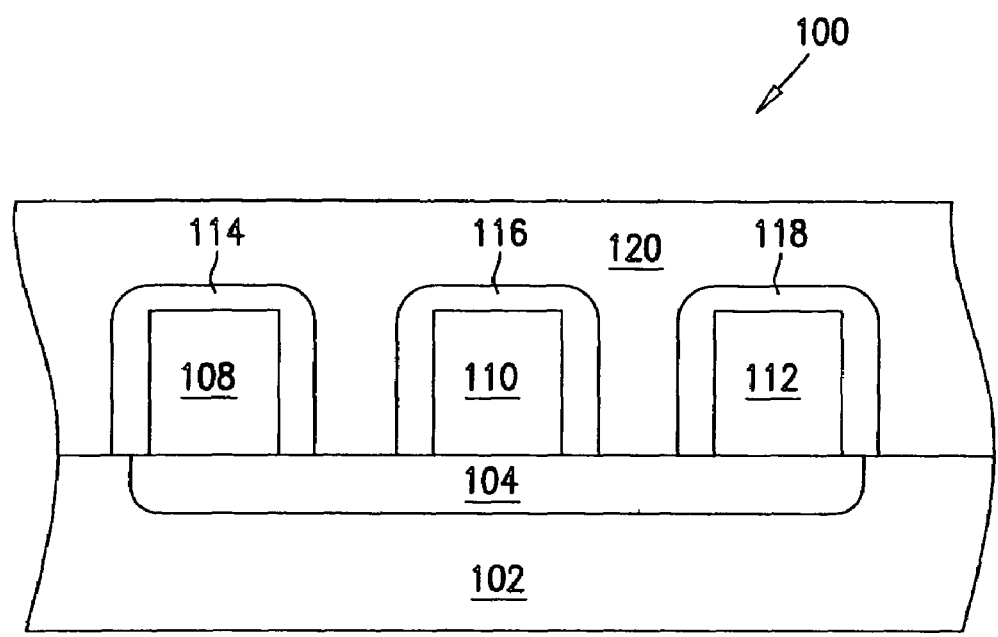
FIG. 1 is a cross-sectional view of a partially-completed integrated circuit.

In the following detailed description of the present invention, reference is made to the accompanying Drawings, which form a part hereof, and in which are shown by way of illustration specific embodiments in which the present invention may be practiced. It should be understood that other embodiments may be utilized and structural changes may be made without departing from the scope of the present invention.

The terms "wafer" or "substrate" used in the following description include any structure having an exposed surface with which to form an integrated circuit of the present invention. The term substrate is understood to include semiconductor wafers. When reference is made to a wafer or substrate in the following description, previous process steps may have been utilized to form regions or junctions or layers in or on the base semiconductor or foundation. Thus, the term substrate is also used to refer to semiconductor structures during processing, and may include other layers that have been fabricated thereupon. Wafer and substrate is understood to include silicon-on insulator (SOI), silicon-on sapphire (SOS), doped and undoped semiconductors, epitaxial layers of silicon supported by a base semiconductor foundation, and other semiconductor structures. The semiconductor need not be siliconbased. The semiconductor could be silicon-germanium, germanium, or gallium arsenide. The term conductor is understood to include semiconductors, and the term insulator is defined to include any material that is less electrically conductive than the materials referred to as conductors.

The present invention provides processes useful for etching through a selected portion of an insulating oxide layer. Although the $C_{2+}F$ gases known in the art offer good selectivity to nitrides, they do not offer very good selectivity to field oxides. Additionally, the prior art $C_{2+}F$ chemistry has the disadvantage that it has a very small process window. This is primarily due to the fact that the prior art $C_{2+}F$ chemistry generates a fluorocarbon polymer which is more carbon-rich than the polymers generated with other types of chemistry. The generation of this carbon-rich fluorocarbon polymer often results in an etch stop condition, which stops the etching process before reaching the substrate. With the prior art $C_{2+}F$ chemistry, etch stop can occur when the gas flow is off even by a small amount from the optimal setting. The insulating oxide etchings of the present invention, on the other hand, are selective to both nitrides and field oxides and are particularly useful in self-aligned contact etchings. Processes according to the present invention can be advantageously utilized in self-aligned contact ("SAC") etch processes, for example, without damaging underlying nitride features, such as caps and spacers, or field oxide regions which may be exposed due to photoresist mask misalignment. In the discussion which follows, the invention is described with reference to a self-aligned contact etch as used in the fabrication of memory devices. However, it should be understood that the invention pertains to any applications which require selectivity to both field oxide regions and nitride layers during the etch of insulating oxide layers.

SAC technology has been widely adopted to reduce area in the fabrication of integrated circuit devices. Referring to FIG. 1, an example of a SAC structure is illustrated in the cross-sectional view of a partially-completed integrated circuit 100. In FIG. 1, on a semiconductor substrate 102 are formed gate stacks 108, 110, and 112 with caps/spacers 114, 116, and 118. Caps/spacers 114, 116, and 118 are typically formed from a nitride such as silicon nitride. Also, shown in FIG. 1 is active region 104. An insulating oxide layer 120 covers the gate stacks, caps/spacers, and the active regions.

Figure 2:
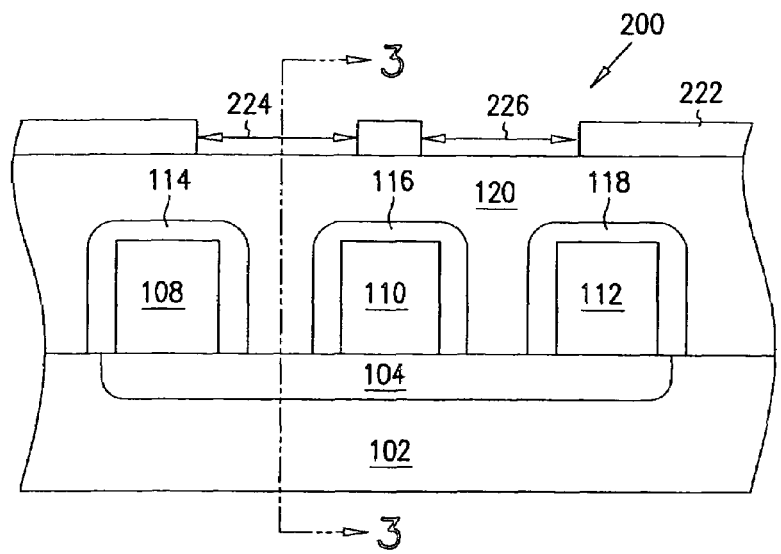
FIG. 2 is a cross-sectional view of the partially-completed integrated circuit of FIG. 1 with a properly aligned photoresist mask.

FIG. 2 shows a partially-completed integrated circuit 200 produced by covering the partially-completed integrated circuit 100 with a patterned photoresist layer (that is, a photoresist mask) 222. In FIG. 2, the photoresist mask 222 covers the insulating oxide layer 120, forming initial openings 224 and 226. In FIG. 2, the photoresist mask 222 is aligned properly.

Figure 3:
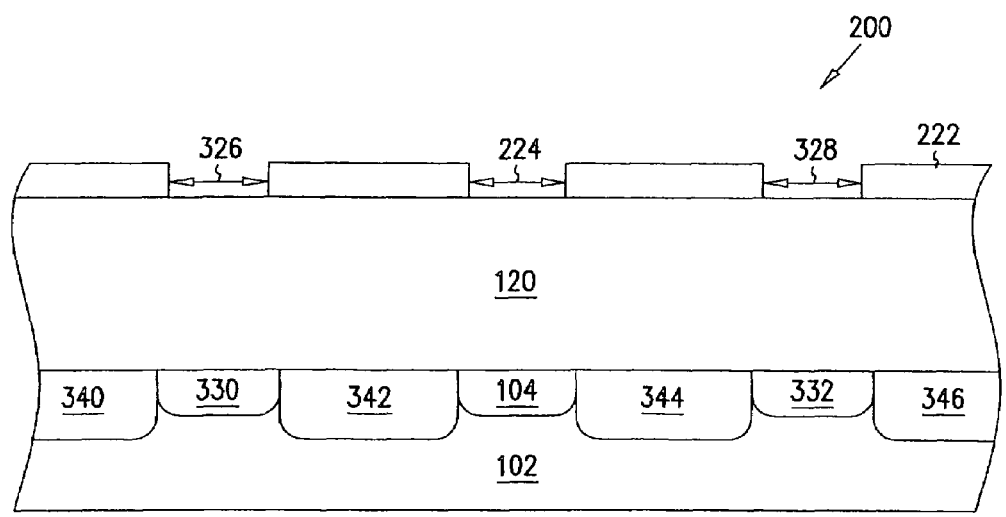
FIG. 3 is a second cross-sectional view of the partially-completed integrated circuit of FIG. 2.

FIG. 3 shows another cross-section of the partially-completed integrated circuit 200. The cross-section shown in FIG. 3 is a cross-section of circuit 200 rotated 90 degrees about the site line 3-3 shown in FIG. 2. FIG. 3 shows active regions 104, 330, and 332 on semiconductor substrate 102. FIG. 3 also shows field oxide regions 340, 342, 344, and 346 on semiconductor substrate 102. In FIG. 3, the photoresist mask 222 covers the insulating oxide layer 120, forming initial openings 224, 326, and 328. The photoresist mask 222 is aligned properly.

Figure 4:
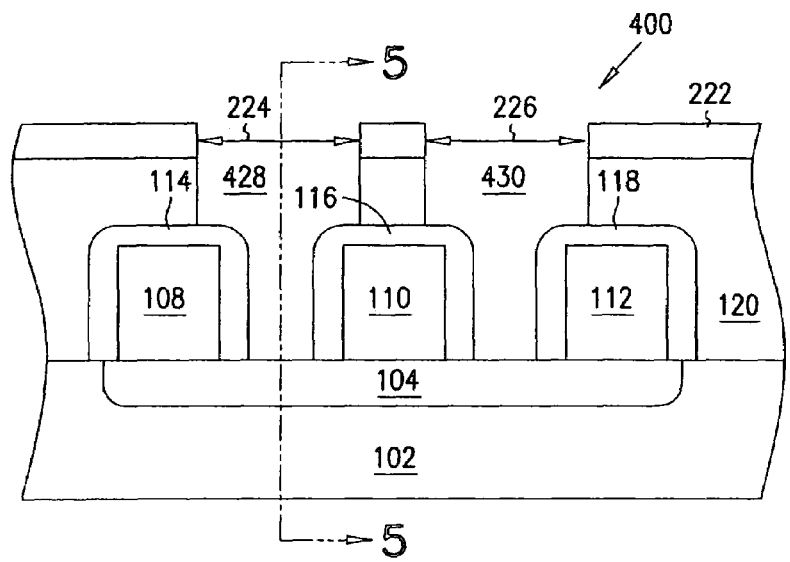
FIG. 4 is a cross-sectional view of the partially-completed integrated circuit of FIG. 2 with contact holes etched.

FIG. 4 shows a cross-sectional view of the partially-completed integrated circuit 400 formed by submitting partially-completed integrated circuit 200 to an etching process. In FIG. 4, the etching process has etched the part of the insulating oxide layer 120 underneath the initial openings 224 and 226 down to, and exposing, active region 104 to form contact holes 428 and 430. The contact holes 428 and 430 should be as narrow as possible to increase the integration level, but the insulating oxide layer 120 thickness is relatively fixed at a significantly larger length. As a result, the contact holes 428 and 430 should have a high aspect ratio of depth to width. High aspect ratios are accomplished with a highly anisotropic etch, with the wall of the contact holes 428 and 430 being greater than, for example, 85 degrees and preferably close to 90 degrees.

The contact holes 428 and 430 have exposed the caps/spacers 114, 116, and 118. However, the etching process was selective to nitride, leaving the exposed portions of the caps/spacers substantially unetched. Had the etching process not been selective to nitrides, portions of the caps/spacers would have been etched away, resulting in a defective integrated circuit. Once the contact holes 428 and 430 are etched they can then be filled with a conductive material, for example, polysilicon, tungsten, aluminum, copper, or mixtures thereof.

Figure 5:
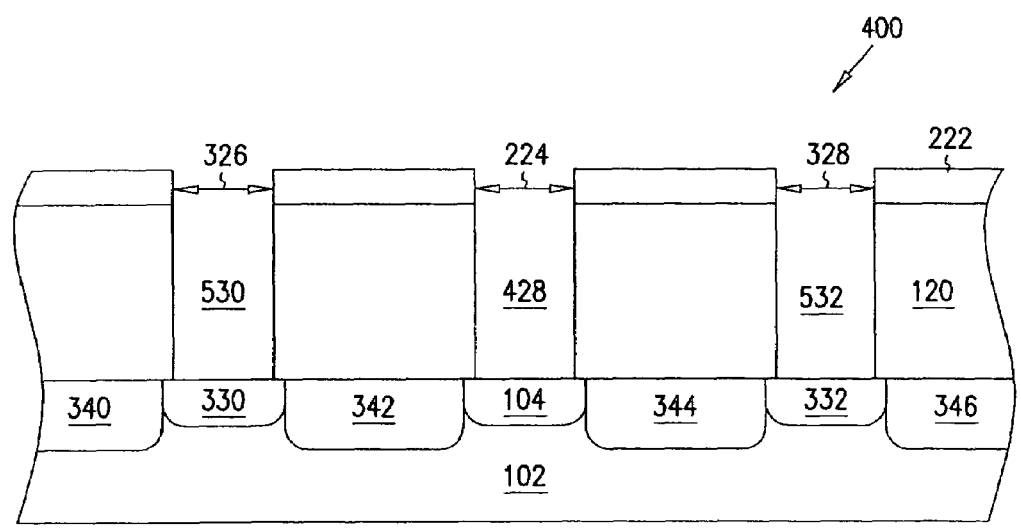
FIG. 5 is a cross-sectional view of the partially-completed integrated circuit of FIG. 4.

FIG. 5 shows another cross-section of the partially-completed integrated circuit 400. The cross-section shown in FIG. 5 is a cross-section of circuit 400 rotated 90 degrees about the site line 5-5 shown in FIG. 4. FIG. 5 shows contact holes 428, 530, and 532 approximately centered over active regions 104, 330, and 332 respectively. Because the photoresist mask 222 is aligned properly, field oxide regions 340, 342, 344, and 346 have not been exposed by the etching of contact holes 428, 530, and 532.

Figure 6:
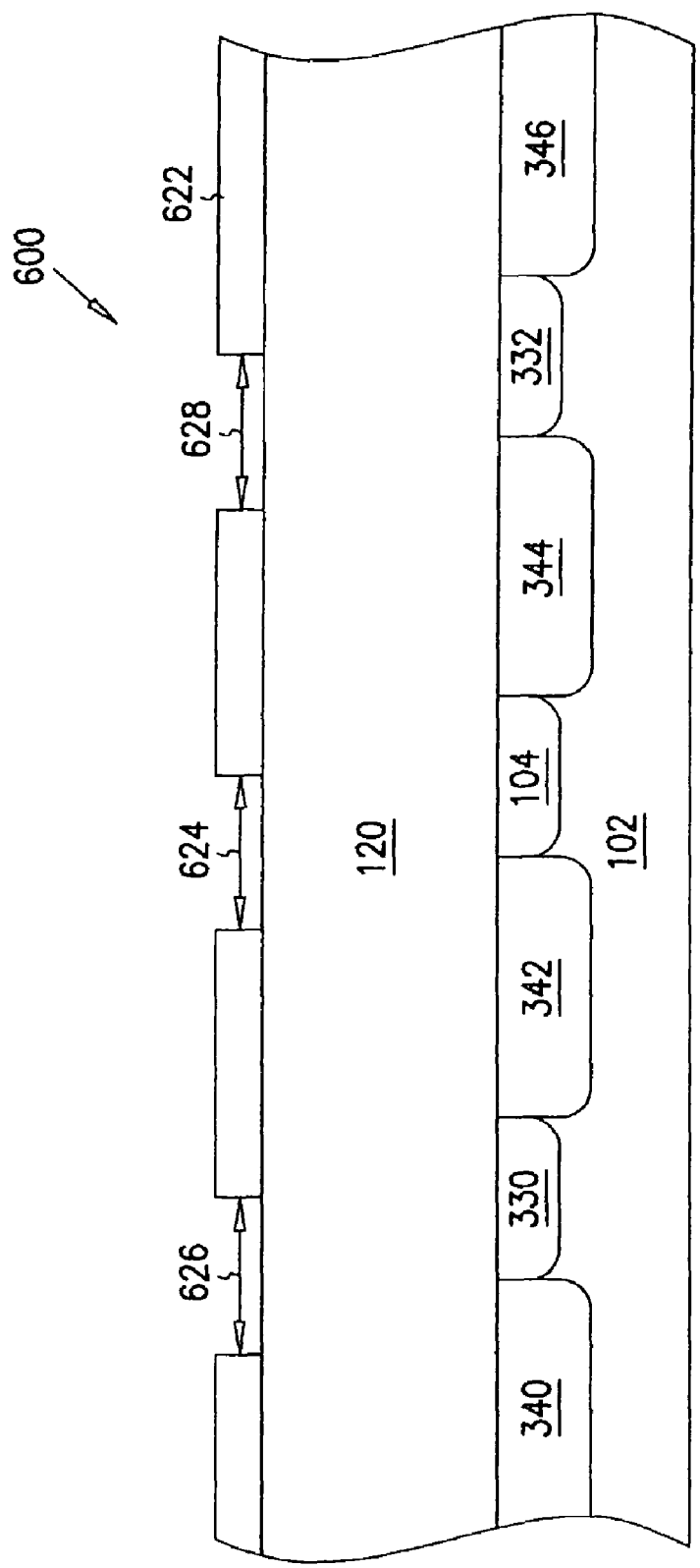
FIG. 6 is a cross-sectional view of a partially-completed integrated circuit with a misaligned photoresist mask.

However, photoresist masks are not always aligned properly. FIG. 6 shows an example of a partially-completed integrated circuit 600 produced by covering the partially-completed integrated circuit 100 with a photoresist mask 622. The photoresist mask 622 is misaligned and is positioned farther to the left than the position of the photoresist mask 222 as shown in FIG. 3 and FIG. 5. Because the photoresist mask 622 is misaligned to the left any contact holes produced by an etching process will also be misaligned to the left.

Figure 7:
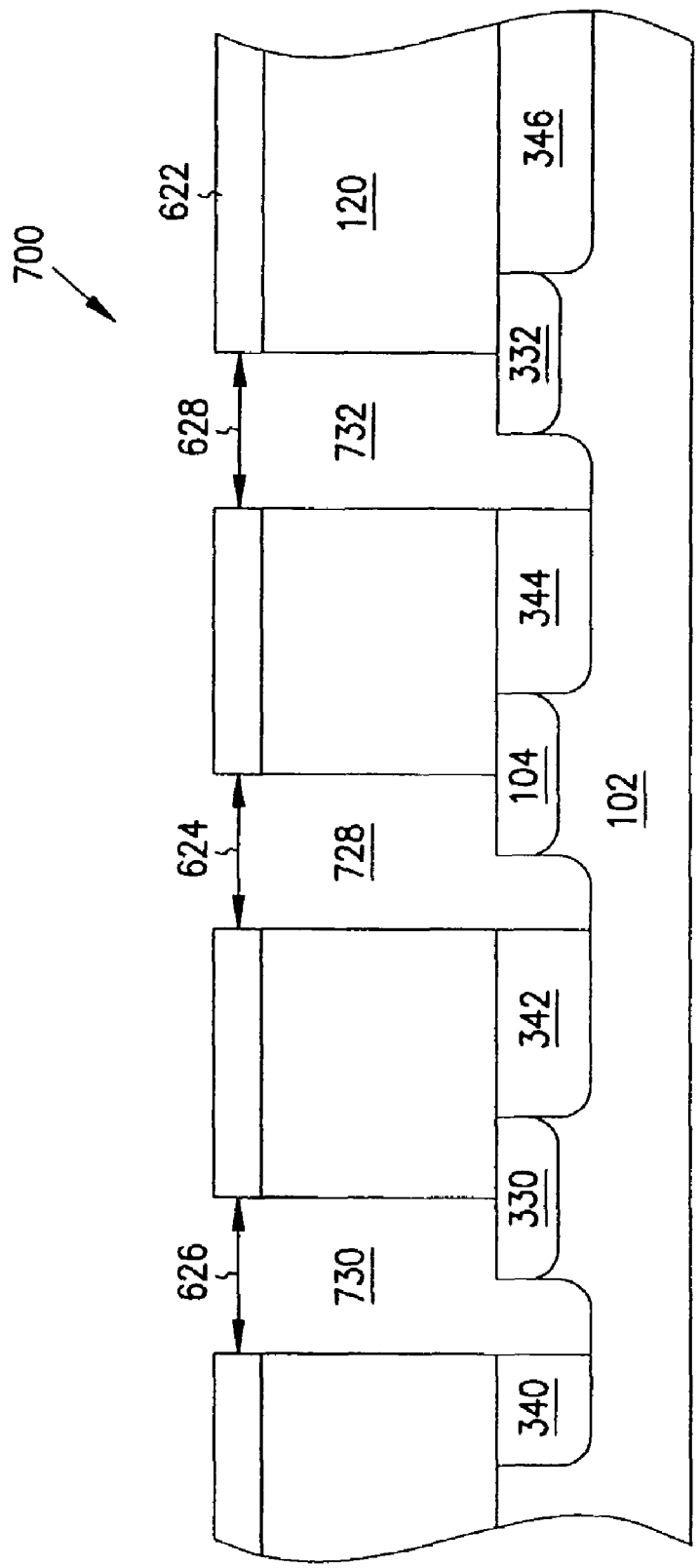
FIG. 7 is a cross-sectional view of the partially-completed integrated circuit of FIG. 6 with contact holes etched according to the prior art.

FIG. 7 shows a partially-completed integrated circuit 700 produced by submitting partially-completed integrated circuit 600 to a prior art etching process, creating contact holes 728, 730, and 732. As shown in FIG. 7, the contact holes 728, 730, and 732 are misaligned due to the misalignment of the photoresist mask 622. The misalignment of contact holes 728, 730, and 732 has caused field oxide regions 340, 342, and 344 to be partially exposed and partially etched away during the etching process. Thus, filling contact holes 728, 730, and 732 with a conducting material during further processing of partially-completed integrated circuit 700 will likely result in a defective integrated circuit being produced.

Figure 8:
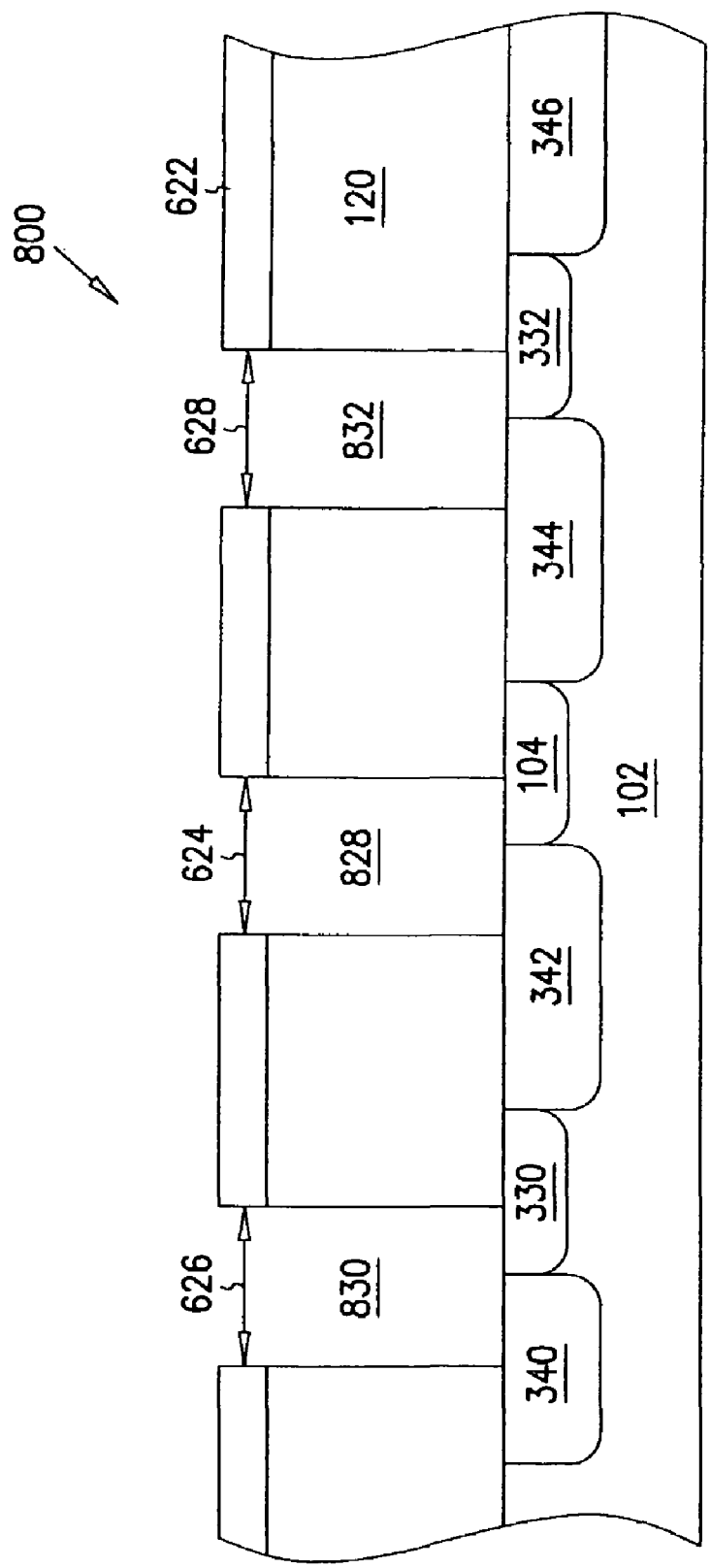
FIG. 8 is a cross-sectional view of the partially-completed integrated circuit of FIG. 6 with contact holes etched according to the present invention.

In contrast to FIG. 7, FIG. 8 shows a partially-completed integrated circuit 800 produced by submitting partially-completed integrated circuit 600 to an etching process of the present invention, creating contact holes 828, 830, and 832. As shown in FIG. 8, field oxide regions 340, 342, 344, and 346 have been exposed due to the misalignment of the photoresist mask. However, contrary to the partially-completed integrated circuit 700 shown in FIG. 7, the etching process of the present invention used to create partially-completed integrated circuit 800 was selective to field oxide and did not appreciably etch any of the field oxide regions 340, 342, 344, and 346. Accordingly, partially-completed integrated circuit 800 is much less likely to become defective after filling the contact holes 828, 830, and 832 with a conductive material during further processing.

Etching processes of the present invention are selective to field oxides as well as nitrides. Thus, in accordance with the present invention, much less field oxide or nitride will be etched when contact holes are misaligned due to misaligned photoresist masks. Accordingly, semiconductor structures and devices can be fabricated using less precise lithography for each level than is required by the prior art. Viewed another way, the present invention provides for higher yields of effective semiconductor devices that the prior art for a given precision level of lithography.

Processes of the present invention may be performed in any of the known plasma processing apparatuses, including those adapted for dry etching, plasma etching, reactive ion etching ("RIE"), magnetically enhanced reactive ion etching ("MERIE"), electron cyclotron resonance ("ECR"), inductively coupled plasma ("ICP") high density etcher or the like. According to the present invention, a substrate having an insulating oxide layer to be etched is placed into a plasma reaction chamber of an appropriate apparatus. The plasma reaction chamber can be any known in the art for conducting prior art etching processes. An etchant gas is introduced into the plasma reaction chamber. The introduction of the etchant gas can be performed in any manner known in the art. The plasma reaction chamber is electrically connected to a power source. Once the substrate to be etched and the etchant gas are in the plasma reaction chamber, power is applied to the plasma reaction chamber, creating a plasma. Methods and techniques for applying power to the plasma reaction chamber in a manner sufficient to create a plasma in the plasma chamber are known in the art.

To further elaborate, in a typical plasma processing chamber adapted for dry etching, the substrate is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known in the art. Species are then formed from the etchant source gas to react with the layers on the substrate and etch away at the plasma-contacting regions of the substrate. By-products, which may be volatile, are then exhausted through an exit port.

Plasma etching relates to the situation where the substrate is positioned on the anode, or ground electrode during substrate processing. On the other hand, reactive ion etching relates to the situation where the substrate is positioned on the cathode, or powered electrode during processing. Magnetically enhanced reactive ion etching represents a variant of the RIE reactor geometry wherein a magnetic field is applied to reduce the loss of energetic electrons to the reactor wall surfaces. It should be understood that the present invention may be practiced in any of the above reactors, as well as other suitable plasma processing reactors.

According to preferred embodiments, the etching process of the present invention can be carried out in a high density plasma (HDP) etcher, or alternatively, in a reactive ion etcher (RIE), including a magnetic-enhanced reactive ion etcher (MERIE). A high density plasma etcher has both a top-powered electrode and a bottom electrode, which is typically a biasable electrostatic chuck. Power is applied to both the top and bottom electrodes with separate power supplies. Typically, the top electrode is powered by "inductive coupling." The frequency at which the top electrode is powered may vary depending on the specific manufacturer of the etcher. The bottom electrode is generally powered by RF with the precise frequency depending on the manufacturer of the etcher.

Figure 9:
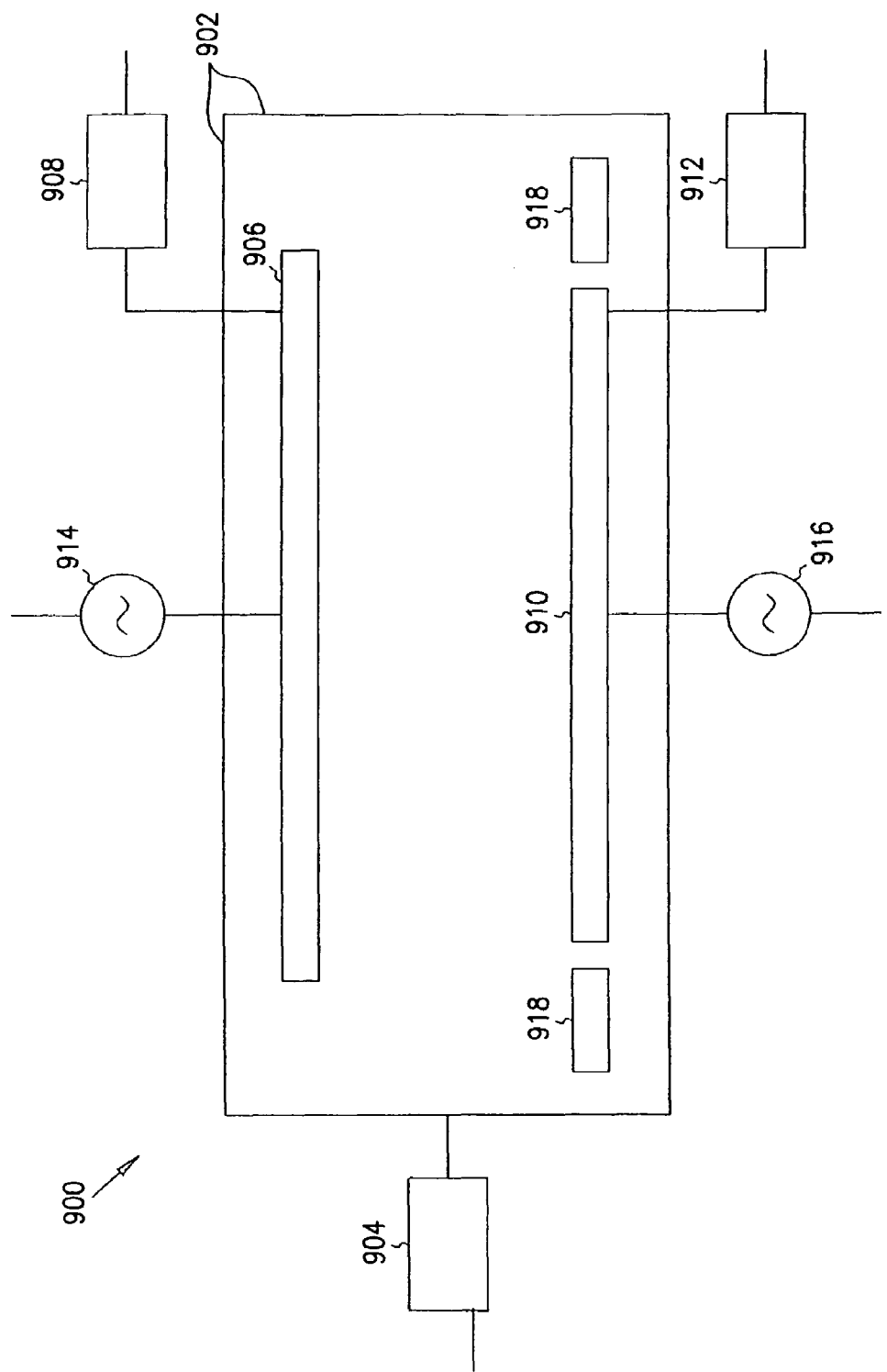
FIG. 9 is a cross-sectional view of a high-density plasma etching apparatus.

FIG. 9 illustrates an example of a high density plasma etcher 900. Etcher 900 comprises chamber sidewalls 902, a top power electrode 906, and an electrostatic chuck/electrode 910. At least portions of sidewalls 902 can be heated by a suitable heater 904. Top power electrode 906 can be cooled by a cooler shown diagrammatically by box 908. A substrate to be etched would lie upon electrostatic chuck 910. The electrostatic chuck 910 can be cooled by a suitable cooler show at 912. Top electrode 906 and electrostatic chuck 910 are powered independently via suitable power supplies 914 and 916, respectively. A plasma focus ring 918 annularly surrounds electrostatic chuck 910. The use of alternate high density plasma etchers are also contemplated within the scope of the present invention. Examples of high-density plasma etchers useful in accordance with the present invention are available from Applied Materials and Lam Research.

In a reactive ion etcher, both the top electrode and sidewalls are typically grounded. RF power is applied to the bottom electrode, typically at a frequency of about 13.56 MHz. Reactive ion etchers are available Tokyo Electron Limited and Applied Materials.

The present invention provides processes for etching contact holes through an insulating oxide layer of a semiconductor substrate down to active regions. Processes of the present invention are selective to both nitrides and field oxides. Thus, contact holes can be etched in accordance with the present invention without significantly etching nitride features, such as caps/spacers and spacers of gate stacks, or field oxide regions. Semiconductor devices produced utilizing etching processes of the present invention are much less likely to be defective due to photoresist mask misalignment than are semiconductor devices produced by etching processes of the prior art.

Insulating oxides useful in the present invention include doped silicon dioxides. Doped silicon dioxides include borophosphosilicate glass ("BPSG"), borosilicate glass ("BSG"), and phosphosilicate glass ("PSG"). Preferred, doped silicon dioxides are substantially composed of silicon dioxide having doping of about 3% or more for boron and about 3% or more for phosphorus.

It should be understood that nitride features can be any structure, such as gates, covered with a nitride layer. Nitride layers comprise, for example, silicon nitride having any of various stoichiometries (for example, $Si_xN_y$). A preferred nitride is $Si_3N_4$. In some embodiments, carbon can be incorporated into a nitride layer during deposition of the nitride layer. To add carbon during the formation of a nitride layer, a carbon-containing gas, for example, methane or other hydrocarbon, can be included in the gas mixture employed during chemical vapor deposition of the nitride. Incorporating carbon into a nitride layer will generally reduce the nitride etch rate.

Field oxide regions, as is known in the art, are frequently used to surround and isolate device areas in and on a semiconductor substrate. They are comprised of an undoped oxide, usually silicon oxide. When referring to field oxides, it is meant the material comprising a field oxide region. One method of forming a field oxide region is by shallow trench isolation ("STI"), in which a shallow trench is etched in the substrate and filled with an undoped oxide (for example, SiO2) that is made essentially planar with the substrate surface. Another method of forming a field oxide region is known in the art as local oxidation of silicon ("LOCOS").

According to the present invention, certain etchant gas compositions exhibit good selectivity to both nitride and field oxide when used in plasma processing apparatus. As is known in the art, the term selective or selectivity refers to an etching process wherein the etch rate for one material is greater than the etch rate of another material. For example, an etching process that is highly selective to nitride means that the etch process etches insulating oxide much more quickly (that is, at a much higher rate) than it etches nitride. Similarly, an etching process that is highly selective to field oxide means that the etch process etches insulating oxide more quickly than it etches field oxide. In selective etching processes, there is generally a tradeoff between etch rate and selectivity. That is, a high etch rate for insulating oxide may be realized at the expense of poor oxide-to-nitride selectivity and high oxide-to-nitride selectivity may be realized at the expense of poor insulating oxide etch rates.

Etchant gases useful in the present invention will comprise a carrier gas; one or more $C_{2+}F$ gases; $CH_2F_2$; and a gas selected from the group consisting of $CHF_3$, $CF_4$, and mixtures thereof. A preferred $C_{2+}F$ gas is $C_4F_8$. Carrier gases are known in the art. The carrier gas is typically an inert gas and is present in the etchant to dilute the etchant gases and to enhance the uniformity of the etching process. Inert gases useful in the present invention include argon ("Ar"), helium ("He"), and xenon ("Xe"). A preferred inert gas is argon.

In one embodiment of the present invention, the etchant consists essentially of one or more $C_{2+}F$ gases, $CH_2F_2$, $CHF_3$, and an inert gas. In another embodiment of the present invention, the etchant consists essentially of one or more $C_{2+}F$ gases, $CH_2F_2$, $CF_4$, and an inert gas. In another embodiment of the present invention, the etchant consists essentially of one or more $C_{2+}F$ gases, $CH_2F_2$, $CHF_3$, $CF_4$, and an inert gas.

As is known in the art, etchant gas compositions typically are controlled by controlling the gas flow rates into the plasma reaction chamber. In preferred embodiments of the present invention, the gas flow rates are as follows: 5 to 20 sccm of $C_{2+}F$ gases, 5 to 20 sccm of $CH_2F_2$, 10 to 30 sccm of $CF_4$, 20 to 50 sccm of $CHF_3$, and 70 to 200 sccm of inert gas.

Other gases may be added to etchant gases of the present invention so long as they are added in amounts small enough to prevent the addition of the gases from significantly diminishing the performance of the etchant gas. The types of gases that can be added and their amounts can be determined by a practitioner of ordinary skill in the art without undue experimentation. For example, etchants of the present invention may optionally comprise $O_2$, CO, or mixtures thereof.

Etching processes of the present invention can be performed at power levels significantly lower than used in the prior art. For purposes of the present invention, the phrase power level will refer to the amount of power per 200 mm of substrate supplied to the bottom electrode in a reactive ion etcher or the top electrode in a high density etcher. Generally in the prior art, etchings using $C_{2+}F$ chemistries are performed at power levels greater than 1200 W, and typically, prior art etchings are performed at power levels of 1500-2000 W. Etchings according to the present invention, on the other hand, preferably are performed at power levels of less than about 1000 W. When processes of the present invention are performed in high density etchers, the bottom electrode is powered to within about 300 W of the top electrode. Etchings of the present invention may be performed at higher power levels, but when performed at higher power levels etchings of the present invention tend to have a higher etch rate for the field oxide (that is, a lower field oxide selectivity).

A substrate being etched in accordance with the present invention can be contacted with the plasma etch for any time sufficient to etch the insulating oxide to a desired distance. It should be understood that these times may vary depending upon the substrate, the etching gas, and the physical parameters of the plasma etch. However, these times can be determined without undue experimentation by a practitioner of ordinary skill in the art.

Semiconductor substrates useful in accordance with the present convention may undergo additional processing steps to fabricate desired components as well as post-etch processing steps that are known in the art. For example, finished semiconductor wafers may be cut into dies, which may then be made into integrated circuit chips. The resulting integrated circuit chips may then be incorporated in electronic devices, for example, any of the well known commercial or consumer electronic devices, including digital computers.

Selective etching processes and etchant gases have been developed. A sufficiently high degree of selectivity to both field oxides and nitrides allows new structures to be fabricated without the need for precise lithography for each level. The selective etching processes of the present invention have the additional advantage of being performed at power levels lower than prior art processes.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method for etching an insulating oxide layer on a substrate, comprising:
    placing the substrate into a plasma reaction chamber;
    introducing into the plasma reaction chamber an etchant gas consisting essentially of a carrier gas, $CH_2F_2$, $CF_4$, $C_4F_6$ and $C_5F_8$; and creating a plasma in the plasma reaction chamber.

2. The method according to claim 1, wherein the carrier gas is selected from the group consisting of argon, helium, and xenon.

3. The method according to claim 1, wherein the carrier gas is argon.

4. The method according to claim 1, wherein the insulating oxide layer is doped silicon dioxide.

5. The method according to claim 1, wherein the insulating oxide layer is borophosphosilicate glass, borosilicate glass, or phosphosilicate glass.

6. A method for etching an insulating oxide layer on a substrate, comprising:
    placing the substrate into a plasma reaction chamber;
    introducing into the plasma reaction chamber an etchant gas consisting essentially of: a carrier gas; both of $C_4F_6$ and $C_5F_8$; $CH_2F_2$; $CHF_3$; and $CF_4$; and
    creating a plasma in the plasma reaction chamber.

7. The method according to claim 6, wherein the step of introducing into the plasma reaction chamber an etchant gas is performed using gas flow rates of 5 to 20 sccm for $CH_2F_2$, 10 to 30 sccm for $CF_4$, 20 to 50 sccm for $CHF_3$, and 70 to 200 sccm for the carrier gas.

8. A method for etching an insulating oxide layer on a substrate, comprising:
    placing the substrate into a plasma reaction chamber;
    introducing into the plasma reaction chamber an etchant gas consisting essentially of a carrier gas, $CH_2F_2$, $CF_4$, $C_4F_8$, $C_4F_6$, and optionally one or more member selected from the group consisting of $CHF_3$, and $C_5F_8$; and
    creating a plasma in the plasma reaction chamber.

9. A method for etching an insulating oxide layer on a substrate, comprising:
    placing the substrate into a plasma reaction chamber; introducing into the plasma reaction chamber an etchant gas consisting essentially of a carrier gas, $CH_2F_2$, $CF_4$, and two or more members selected from the group consisting of $CHF_3$, $C_4F_6$ and $C_5F_8$; and creating a plasma in the plasma reaction chamber at a power level of less than about 1000 W per 200 mm of substrate.

10. The method according to claim 9, wherein the etchant gas consists essentially of: a carrier gas; $C_4F_6$ and $C_5F_8$; $CH_2F_2$; and $CF_4$.

11. The method according to claim 9, wherein the etchant gas consists essentially of: a carrier gas; $C_4F_6$ and $C_5F_8$; $CH_2F_2$; $CHF_3$; and $CF_4$.

12. The method according to claim 9, wherein the step of introducing into the plasma reaction chamber an etchant gas is performed using gas flow rates of 5 to 20 sccm for $CH_2F_2$, 20 to 50 sccm for $CHF_3$, and 70 to 200 sccm for the carrier gas.

13. The method according to claim 9, wherein the carrier gas is selected from the group consisting of argon, helium, and xenon.

14. The method according to claim 9, wherein the carrier gas is argon.

15. The method according to claim 9, wherein the insulating oxide layer is doped silicon dioxide.

16. The method according to claim 9, wherein the insulating oxide layer is borophosphosilicate glass, borosilicate glass, or phosphosilicate glass.

* * * * *